United States Patent [19]
Aramaki et al.

[11] Patent Number: 4,863,762
[45] Date of Patent: Sep. 5, 1989

[54] METHOD OF FORMING COATING FILM OF FLUORORESIN BY PHYSICAL VAPOR DEPOSITION

[75] Inventors: Minoru Aramaki; Masahiro Kubo; Hisaji Nakano; Hiroyuki Kurashige, all of Ube, Japan

[73] Assignee: Central Glass Company, Limited, Ube City, Japan

[21] Appl. No.: 169,834

[22] Filed: Mar. 18, 1988

[30] Foreign Application Priority Data

Mar. 31, 1987 [JP] Japan .................................. 62-75977

[51] Int. Cl.$^4$ .............................................. C23C 16/00

[52] U.S. Cl. ............................ 427/255.6; 204/192.14; 204/192.15; 204/192.31; 427/255

[58] Field of Search .................. 427/255.6, 255, 385.5, 427/388.1, 393.5; 204/192.14, 192.15, 192.31, 192.22

[56] References Cited

U.S. PATENT DOCUMENTS

| | | | |
|---|---|---|---|
| 2,893,900 | 7/1959 | Machlin | 427/255.6 |
| 3,071,856 | 1/1963 | Fischbein | 30/346 |
| 3,665,269 | 5/1972 | Wright et al. | 427/255.6 |
| 4,013,532 | 3/1977 | Cormia et al. | 204/192.15 |
| 4,153,925 | 5/1979 | Gazard et al. | 427/255.6 |
| 4,415,419 | 11/1983 | Niederhaeuser et al. | 204/192.15 |
| 4,464,422 | 8/1984 | Senda et al. | 204/192.31 |
| 4,543,275 | 9/1985 | Akashi et al. | 427/255.6 |
| 4,551,349 | 11/1985 | Kovacena et al. | 427/255.6 |
| 4,718,907 | 1/1988 | Karwoski et al. | 427/255.6 |

FOREIGN PATENT DOCUMENTS

| | | | |
|---|---|---|---|
| 1471546 | 1/1969 | Fed. Rep. of Germany | 427/255.6 |
| 45-20821 | 7/1970 | Japan | 427/255.6 |
| 54-20974 | 2/1979 | Japan | 427/255.6 |
| 1298453 | 12/1972 | United Kingdom | 427/255.6 |
| 1357347 | 6/1974 | United Kingdom | 427/255.6 |
| 1435811 | 5/1976 | United Kingdom | 204/192.15 |

OTHER PUBLICATIONS

Encyclopedia of Polymer Science and Technology, vol. 13, pp. 627–630, (1970).

*Primary Examiner*—Sadie Childs
*Attorney, Agent, or Firm*—Fleit, Jacobson, Cohn, Price, Holman & Stern

[57] ABSTRACT

In forming a coating film of a fluororesin, e.g. polytetrafluoroethylene, on a metallic or nonmetallic surface by a physical vapor deposition technique, problems attributed to the necessity of intensely heating or bombarding the fluororesin as the evaporating source or target material are solved by using a molecular weight reduced fluororesin not higher than 5000 in molecular weight. It is best to use a low molecular weight fluororesin powder obtained by heating a high molecular weight fluororesin in presence of a fluorine source and precipitating the molecular weight reduced polymer from the reaction gas.

8 Claims, 1 Drawing Sheet

METHOD OF FORMING COATING FILM OF FLUORORESIN BY PHYSICAL VAPOR DEPOSITION

BACKGROUND OF THE INVENTION

This invention relates to a method of forming a coating film of a fluororesin such as, for example, polytetrafluoroethylene on a metallic or nonmetallic substrate surface by using a physical vapor deposition technique.

Fluororesins represented by polytetrafluoroethylene (PTFE) exhibit excellent lubricity and water repellency. Accordingly industrial applications of fluororesins include lubricating and water repelling coating films on various articles. There are many cases where it is desired to form a thin coating film of a fluororesin by a dry coating technique. For example, JP-A 54-20974 shows co-deposition of a metal and a fluororesin to improve lubricity of sliding parts of precision devices such as watches and cameras, and JP-A 55-130133 shows using a fluororesin coating film on a semiconductor chip for enhancement of stability and water resistance of surface areas around electrodes or a protective oxide film surface.

It was proposed to form a fluororesin coating film by plasma polymerization on the surface of a substrate. However, fluoro-monomers suitable for plasma polymerization are very costly, and an intricate apparatus has to be used. Also it was proposed to employ a physical vapor deposition technique such as sputtering or vacuum evaporation for forming a coating film of fluororesin. However, sputtering seems rather disadvantageous because, aside from intricacy of the apparatus, a considerably high discharge voltage is required for effectively bombarding a fluororesin so that the temperature of the substrate rises undesirably. Vacuum evaporation of a fluororesin seems more favorable, but industrial applications of this technique have encountered difficulties attributed to very good thermal stability of fluororesins. For depolymerization and evaporation of a conventional fluororesin it is necessary to heat the fluororesin above 500° C., and such intense heating of the evaporating source places restrictions on the substrate material which should endure the radiant heat from the evaporating source.

SUMMARY OF THE INVENTION

The present invention relates to a method of forming a coating film of a fluororesin, i.e. fluorine-containing polymer, on a substrate surface by using a physical vapor deposition technique and has an object of providing an improved method by which a good coating film can be formed without unnecessarily raising the temperature of the substrate.

According to the invention there is provided a method of forming a coating film of a fluorine-containing polymer on a substrate surface by a physical vapor deposition technique, characterized in that a molecular weight reduced fluorine-containing polymer lower than 5000 in molecular weight is used as the source material for physical vapor deposition.

At present this invention is considered to be most suitable for application to vaccum evaporation of a fluoropolymer, though it is also possible to apply the same to sputtering or ion plating of a fluororesin. When a fluororesin precedingly adequately reduced in molecular weight is used as the evaporating source in a vacuum evaporation operation, the fluororesin easily undergoes depolymerization and evaporation at a relatively low temperature compared with an ordinarily high molecular weight fluororesin of similar chemical composition. Accordingly the substrate is not unnecessarily heated and, hence, is not required to be highly resistance to heat. When the same low molecular weight fluororesin is used as the target material in a sputtering operation or an ion plating operation the discharge voltage for the operation can be lower than in the case of using an ordinarily high molecular weight fluororesin, so that a rise in the substrate temperature is reduced.

A method of converting an ordinary fluorine-containing polymer into an adequately lower molecular weight polymer in the form of fine solid particles is disclosed in copending U.S. patent application Ser. No. 127,364. According to the disclosed method, a fluorine-containing polymer is heated to a temperature not lower than its melting temperature and not higher than 600° C. in the presence of a fluorine source material such as molecular fluorine, nitrogen trifluoride or chlorine trifluoride, and a hot reaction gas produced by reaction of fluorine with the polymer is extracted from the reactor and cooled to precipitate the molecular weight reduced fluorine-containing polymer contained in the reaction gas.

In the present invention it is very suitable to use a molecular weight reduced fluorine-containing polymer obtained by the method disclosed in the copending application, and it is preferred to use a fluorine-containing polymer whose molecular weight is in the range from about 1000 to about 3000.

A fluororesin coating film formed by a method according to the invention mainly serves the purposes of affording the coated surface with lubricity, insulation, water and oil repellency and/or solvent resistance. A good coating film can be formed on not only metallic surfaces but also inorganic nonmetallic surfaces and organic plastics surfaces. For example, this invention is of use for providing a fluororesin coating film to electroplated metal films, floppy disks and other types of magnetic recording disks, maskings for use in the fabrication of electronic devices, etc.

DESCRIPTION OF THE PREFERRED EMBODIMENTS

Various fluororesins can be used in the present invention insofar as the molecular weight is adequately low as stated above. Examples of useful fluororesins are PTFE, copolymers of ethylene and tetrafluoroethylene (TFE), copolymers of TFE and hexafluoropropylene, copolymers of TFE and a perflucroalkoxyethylene, polychlorotrifluoroethylene, polyvinylidene fluoride and polyvinyl fluoride.

Figure 1:
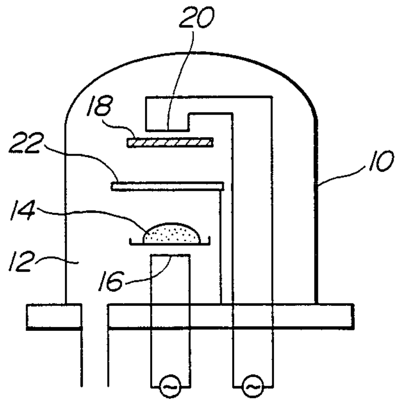
FIG. 1 is a schematic illustration of a vacuum evaporation apparatus used in an example of the present invention.

FIG. 1 shows a conventional vacuum evaporation apparatus which can be employed for a coating method according to the invention. The apparatus comprises a bell jar type vessel 10 which provides therein a vacuum chamber 12. As the evaporating source a low molecular weight fluororesin 14, preferably in powder form as mentioned hereinbefore, is placed at a usual position in the vacuum chamber. There is a resistance heater 16 to heat the evaporating source 14. A substrate 18 on which the fluororesin 14 is to deposit is placed above and at a suitably adjusted distance from the evaporating source 14, and a resistance heater 20 is provided to heat the substrate 18. A freely openable shutter 22 is disposed between the evaporating source 14 and the substrate 18.

The magnitude of vacuum in the vacuum chamber 12 is regulated to a desired level within the range from $10^{-1}$ to $10^{-6}$ Torr, and then the low molecular weight fluororesin 14 is heated. If the pressure in the chamber 12 is higher than $10^{-1}$ Torr the molecules of the residual gas constitute a serious obstruction to free movement of the molecules of the evaporated fluororesin. Therefore, the molecules of the evaporated fluororesin remain short in their mean free path and, before arriving at the substrate 18, repeatedly collide against each other with resultant growth to large particles and loss of kinetic energy and soon fall down. Although a very high vacuum is favorable for vacuum evaporation operations, it is difficult in industrial practice to keep the pressure in the chamber 12 below $10^{-6}$ Torr. In practice a vacuum of $10^{-4}$ Torr suffices for accomplishment of good vacuum evaporation in view of the fact that mean free path of air reaches about 50 cm at $10^{-4}$ Torr.

The low molecular weight fluororesin 14 is heated to a suitable temperature, which depends on the kind and molecular weight of the fluororesin and generally ranges from 100° C. to 350° C. When the temperature is below 100° C. even a low molecular weight fluororesin does not readily undergo depolymerization and evaporation, and a long time is required for accomplishment of desired deposition because of low density of the molecules of the evaporation material in the vacuum chamber 12. On the other hand, heating the fluororesin 14 to a temperature higher than 350° C. promotes depolymerization and evaporation of the fluororesin and augments kinetic energy of the evaporated molecules so that the rate of deposition of the substrate 18 is enhanced. However, when the evaporating source 14 is heated to such a high temperature there will arise troubles such as deformation or deterioration of the substrate 18 and difficulty of controlling the thickness of the film deposited on the substrate 18.

A suitable distance of the substrate 18 from the evaporating source 14 is from 5 to 50 cm, though it depends on the type and size of the vacuum evaporation apparatus. When the distance is more than 50 cm the distance will be greater than the mean free path of the molecules of the evaporated fluororesin, so that most of the fluororesin molecules lose kinetic energy and fall down before arriving at the substrate 18. It seems that the efficiency of the operation would be maximized by minimizing the distance between the substrate 18 and the evaporating source 14. Actually, when the distance is shorter than 5 cm the evaporated molecules do not uniformly deposit on the substrate, and the substrate is liable to be deformed or deteriorated by the radiant heat from the evaporating source.

The thickness of the coating film deposited on the substrate 18 can be controlled over a wide range from a few nanometers to several micrometers by opening and closing the shutter 22 at appropriately controlled timing.

Since low molecular weight fluororesins can efficiently be evaporated at fairly low temperatures, the material of the substrate 18 is not particularly limited. For example, metals represented by aluminum and copper, glasses, ceramics, synthetic resins represented by polycarbonate and synthetic rubbers can be coated by a method according to the invention.

It is effective to heat the substrate 18 by using the heater 20 to a temperature in the range from 50° to 300° C. for further improving tightness of adhesion of the deposited film to the substrate surface.

It is suitable to carry out the vacuum evaporation operation for a few seconds to tens of minutes, and preferably for 5–30 min. If the operation time is too short deposition of a film remains incomplete. If the operation time is too long the result will be failure to obtain a uniform coating film by reason of growth of crystals of the deposited fluororesin.

A fluororesin coating film with a very smooth surface, which has a thickness in the range from a few nanometers to several micrometers as mentioned above, can be formed by carrying out a vacuum evaporation operation according to the invention under the above described conditions. By X-ray diffractometry it was clarified that the thus formed coating film of fluororesin is usually amorphous. Amorphousness of the coating film is very favorable for tight and strong adhesion of the film to the substrate surface.

Fluororesin coating films formed by a method according to the invention are excellent in water repellency. With water the angle of contact of each coating film is from 100° to 120°. With respect to lubricity, coating films formed by a method according to the invention are better than fluororesin coating films formed by conventional deposition methods using high molecular weight fluororesins. The coefficient of friction of a film deposited by the invention is from 0.05 to 0.15.

The invention is further illustrated by the following nonlimitative examples.

EXAMPLE 1

A reactor made of nickel was kept heated at 500° C., and a mixture of 10% of fluorine gas and 90% of nitrogen gas was continuously introduced into the reactor at a rate of 1 l/min. Simultaneously, coarsely milled PTFE having molecular weight of about 8500 was continuously introduced into the reactor at a rate of 20 g/hr. The milled PTFE had a mean particle size of about 1 mm. Using a pump the reaction gas was continuously extracted from the reactor at a rate of 30–50 l/min and cooled to about 30°–40° C. to thereby precipitate molecular weight reduced PTFE. After separating the precipitated polymer the gas was recycled to the reactor. The above operation was continued for 4 hr. As the result 40 g of a fine, snow-white powder of PTFE was collected. The particles of this PTFE powder were 0.1 to 1 μm in size. The obtained PTFE powder had a melting point of 265° C., and the molecular weight of this polymer was calculated to be 1500 from the following relationship between melting point ($T_m$) and molecular weight (MW), shown in U.S. Pat. No. 3,067,262.

$$MW = \frac{200}{685[1/T_m(°K.) - 1/600]}$$

Figure 2:
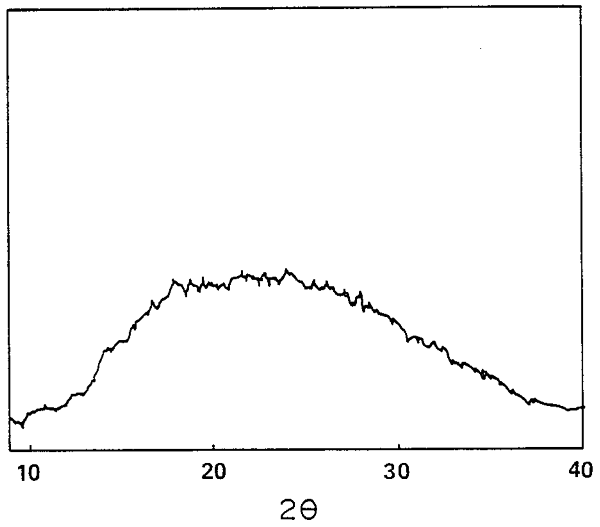
FIG. 2 is an X-ray diffractometry pattern of a PTFE coating film formed by a vacuum evaporation method according to the invention.

In a vacuum evaporation apparatus of the type shown in FIG. 1, 1 g of the low molecular weight PTFE powder obtained by the above process was placed as the evaporating source, and an aluminum plate 30 mm×70 mm in widths was used as the substrate. Vacuum evaporation of the low molecular weight PTFE was carried out by heating the PTFE powder for 20 min at 250° C. under vacuum of $10^{-4}$ Torr, while the aluminum substrate was kept heated at 190° C. As the result of PTFE coating film having thickness of 2–3 μm was formed on the aluminum plate. By observation with scanning electron microscope this coating film proved to have a very smooth surface. FIG. 2 shows the result of X-ray diffraction analysis, which revealed amorphousness of the PTFE coating film.

The coefficient of friction of the PTFE coating film was measured with a friction tester of the Bowden-Leben type. A load of 500 g was applied to each sample by using a steel ball having a diameter of 8 mm, and the friction speed was 0.1 m/min. Besides, the angle of contact of the PTFE coating film with water was measured by the projection method. The results are tabled hereinafter together with the results of the same tests on the coating films formed in the subsequent examples and comparative example. For the sake of reference, the aluminum plate itself (without coating) was subjected to the same tests.

EXAMPLE 2

The vacuum evaporation of the low molecular weight PTFE prepared in Example 1 was repeated in the same apparatus and under the same conditions, except that the PTFE powder was heated at 300° C. and that the aluminum substrate was kept heated at 220° C. A good coating film was formed on the substrate.

EXAMPLE 3

The vacuum evaporation operation of Example 2 was repeated except that a copper plate was used as the substrate in place of the aluminum plate. A good coating film was formed.

EXAMPLE 4

A sheet of a copolymer of tetrafluoroethylene and hexafluoropropylene (TFE-HFP) was cut into 5 mm square pieces. The copolymer had m.p. of 277° C. In a reactor 50 g of the TFE-HFP pieces was heated to 500° C. Then a mixture of 5% of fluorine gas and 95% of nitrogen gas was continuously introduced into the reactor at a rate of 1 l/min, and the reaction gas was extracted from the reactor and passed through a cooler to precipitate and collect molecular weight reduced TFE-HFP in the form of a fine powder. This powder had m.p. of 170° C., which indicates molecular weight considerably lower than 5000.

In the vacuum evaporation apparatus used in the foregoing examples, 1 g of the low molecular weight TFE-HFP copolymer powder was heated at 250° C. under vacuum of $10^{-4}$ Toff for deposition on an aluminum plate kept heated at 200° C. A good coating film was formed.

EXAMPLE 5

A copolymer of tetrafluoroethylene and perfluoroalkoxyethylene (TFE-PFA), which was in the form of pellets (about 3 mm in diameter and about 5 mm in length) and had m.p. of 340° C., was subjected to the molecular weight reducing treatment described in Example 4. The obtained TFE-PFA copolymer powder had m.p. of 200° C., which indicates molecular weight considerably lower than 5000.

Using the TFE-PFA copolymer powder as the evaporating source, the vacuum evaporation operation of Example 4 was repeated under the same conditions. A good coating film was formed.

EXAMPLE 6

The low molecular weight PTFE powder prepared in Example 1 was used as the target material in a sputtering operation to deposit a coating film of PTFE of an aluminum plate. The sputtering was carried out by application of a high-frequency voltage while argon gas was passed through the sputtering chamber to keep a vacuum of $10^{-3}$ Torr.

COMPARATIVE EXAMPLE

A commercial PTFE molding powder having molecular weight of about 8500 was used as the evaporating source in the vacuum evaporation operation described in Example 1. The PTFE powder was heated to 550° C. while the aluminum substrate was heated at 480° C.

| | Coating Material | Substrate | Angle of Contact (degree) | Coefficient of Friction |
|---|---|---|---|---|
| Ex. 1 | low MW PTFE | aluminum | 108 | 0.11 |
| Ex. 2 | " | aluminum | 111 | 0.06 |
| Ex. 3 | " | copper | 109 | 0.07 |
| Ex. 4 | low MW TFE—HFE | aluminum | 105 | 0.11 |
| Ex. 5 | low MW TFE—PFA | aluminum | 106 | 0.10 |
| Ex. 6 | low MW PTFE | aluminum | — | 0.09 |
| Ref. | — | aluminum | 77 | 0.27 |
| Comp. Ex. | high MW PTFE | aluminum | 92 | 0.18 |

The above test results indicate that fluororesin coating films formed by physical vapor deposition of low molecular weight polymers are superior in lubricity and water repellency.

What is claimed is:

1. A method of forming a film of a fluorine-containing polymer on a substrate surface by a physical vapor deposition technique, comprising providing a molecular weight reduced fluorine-containing polymer having a molecular weight lower than 5000, said molecular weight reduced fluorine-containing polymer being fine particles precipitated from a reaction gas produced by reacting a fluorine-containing polymer having a molecular weight higher than 5000 with fluorine at an elevated temperature; and using said molecular weight reduced fluorine-containing polymer as the source material for physical vapor deposition.

2. A method according to claim 1, wherein said physical vapor deposition technique is selected from the group consisting of vacuum evaporation technique, sputtering technique and ion plating technique.

3. A method according to claim 1, wherein said physical vapor deposition technique is vacuum evaporation technique, said molecular weight reduced fluorine-containing polymer being heated at a temperature in the range from 100° to 350° C. at a pressure in the range of from $10^{-1}$ to $10^{-6}$ Torr.

4. A method according to claim 1, wherein said molecular weight reduced fluorine-containing polymer is selected from the group consisting of polytetrafluoroethylene, polychlorotrifluoroethylene, polyvinylidene fluoride, polyvinyl fluoride, copolymer of ethylene and tetrafluoroethylene, copolymer of tetrafluoroethylene and hexafluoropropylene and copolymer of tetrafluoroethylene and a perfluoroalkoxyethylene.

5. A method according to claim 1, wherein said substrate surface is a metallic surface.

6. A method according to claim 1, wherein said substrate surface is an organic polymer surface.

7. A method according to claim 1, wherein said substrate surface is an inorganic nonmetallic surface.

8. A method of forming a film of polytetrafluoroethylene on a substrate surface by vacuum evaporation technique, comprising using fine particles of polytetrafluoroethylene having a molecular weight of from about 1000 to about 3000 as the evaporating source, said particles being precipitated from a reaction gas produced by reacting polytetrafluoroethylene having a molecular weight higher than 3000 with fluorine at an elevated temperature, and heating the particles of polytetrafluoroethylene at a temperature in the range from 100° to 350° C. at a pressure in the range of from $10^{-1}$ to $10^{-6}$ Torr.

* * * * *